(12) United States Patent
Misawa et al.

(10) Patent No.: US 7,064,060 B2
(45) Date of Patent: Jun. 20, 2006

(54) METHOD FOR MANUFACTURING SEMICONDUCTOR DEVICE

(75) Inventors: Kaori Misawa, Tsukuba (JP); Naofumi Ohashi, Tokyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 34 days.

(21) Appl. No.: 11/010,344

(22) Filed: Dec. 14, 2004

(65) Prior Publication Data
US 2005/0191847 A1    Sep. 1, 2005

(30) Foreign Application Priority Data
Feb. 26, 2004    (JP)    ............................ 2004-051432

(51) Int. Cl.
*H01L 21/4763* (2006.01)
(52) U.S. Cl. ...................... 438/637; 438/634; 438/681; 438/687; 438/763; 438/781
(58) Field of Classification Search ................ 438/634, 438/637, 763, 781, FOR 355, FOR 388, 438/FOR 395, FOR 489, 645, 648, 653, 438/681, 687, 692, 706
See application file for complete search history.

(56) References Cited

U.S. PATENT DOCUMENTS

| | | | |
|---|---|---|---|
| 6,093,636 A * | 7/2000 | Carter et al. ................ | 438/623 |
| 6,451,712 B1 | 9/2002 | Dalton et al. | |
| 6,844,257 B1 * | 1/2005 | Fornof et al. ................ | 438/634 |
| 2002/0074659 A1 * | 6/2002 | Dalton et al. ................ | 257/758 |
| 2002/0123240 A1 * | 9/2002 | Gallagher et al. .......... | 438/781 |
| 2003/0010961 A1 | 1/2003 | Fukuyama et al. | |
| 2004/0152336 A1 * | 8/2004 | Miura et al. ................. | 438/761 |
| 2004/0197474 A1 * | 10/2004 | Vrtis et al. ............. | 427/255.28 |
| 2005/0054209 A1 * | 3/2005 | Hsu et al. .................... | 438/725 |
| 2005/0101157 A1 * | 5/2005 | Yunogami et al. .......... | 438/781 |
| 2005/0118782 A1 * | 6/2005 | Kim et al. ................... | 438/409 |

FOREIGN PATENT DOCUMENTS

| JP | 11-310411 | 11/1999 |
|---|---|---|
| JP | 2002-050687 | 2/2002 |

* cited by examiner

*Primary Examiner*—Michelle Estrada
(74) *Attorney, Agent, or Firm*—Leydig, Voit & Mayer, LTD

(57) ABSTRACT

A heat treatment is performed to an insulating film composition, formed on a semiconductor substrate, at a temperature of 350° C. in an inert gas ambient to form a non-porous insulating film. Next, dry etching is performed using a resist pattern as a mask to form a trench in the non-porous insulating film, ashing is performed to remove the resist pattern, and the surface of the semiconductor substrate is cleaned. Thereafter, a second heat treatment is performed for the non-porous insulating film to form a porous insulating film. Since the second heat treatment is performed in an oxidizing-gas atmosphere, the pore-generating material can be removed at a temperature lower than the temperature of conventional methods to form an insulating film having a low dielectric constant.

4 Claims, 11 Drawing Sheets

Fig.1
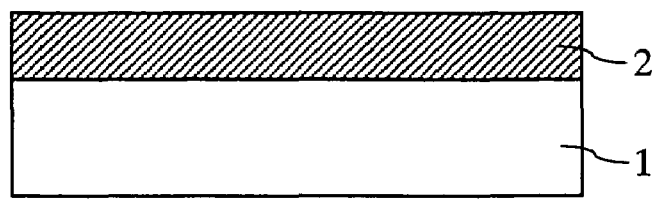
Fig.2
Heat
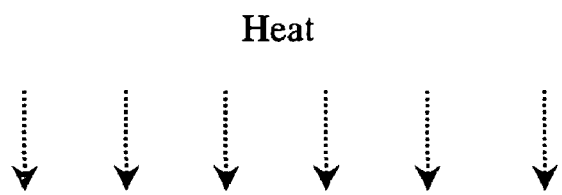
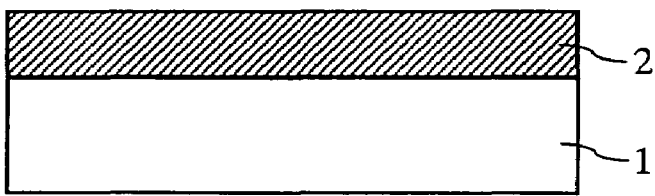
Fig.3
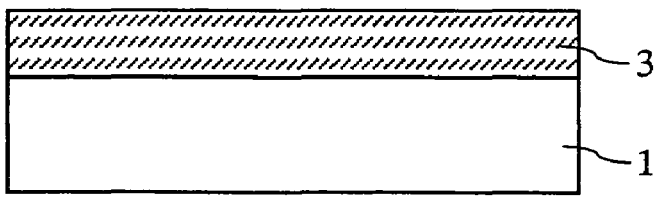

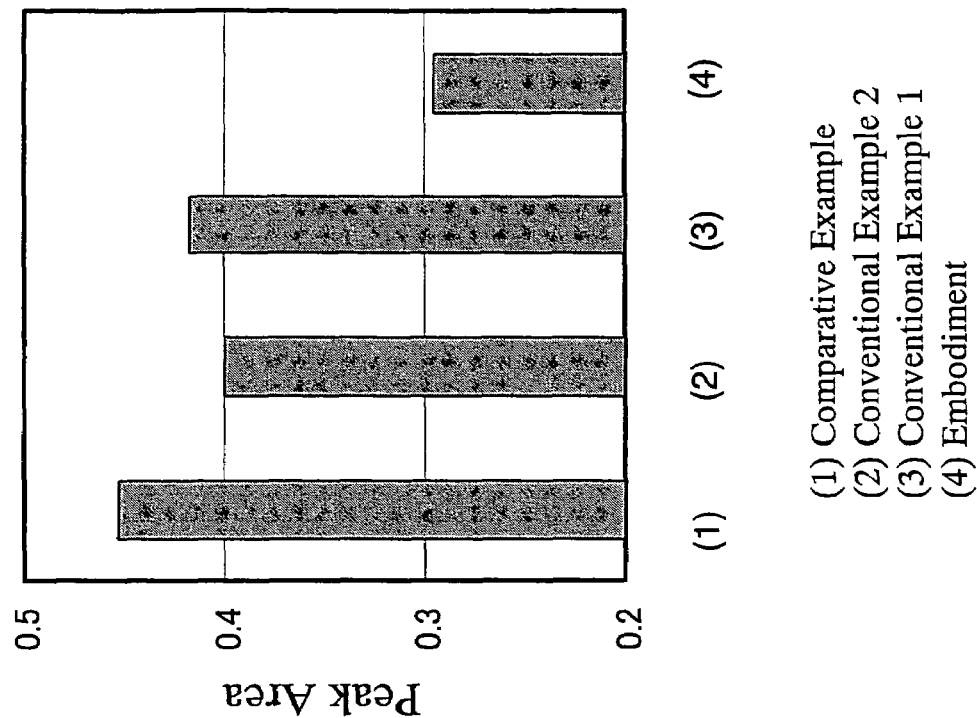
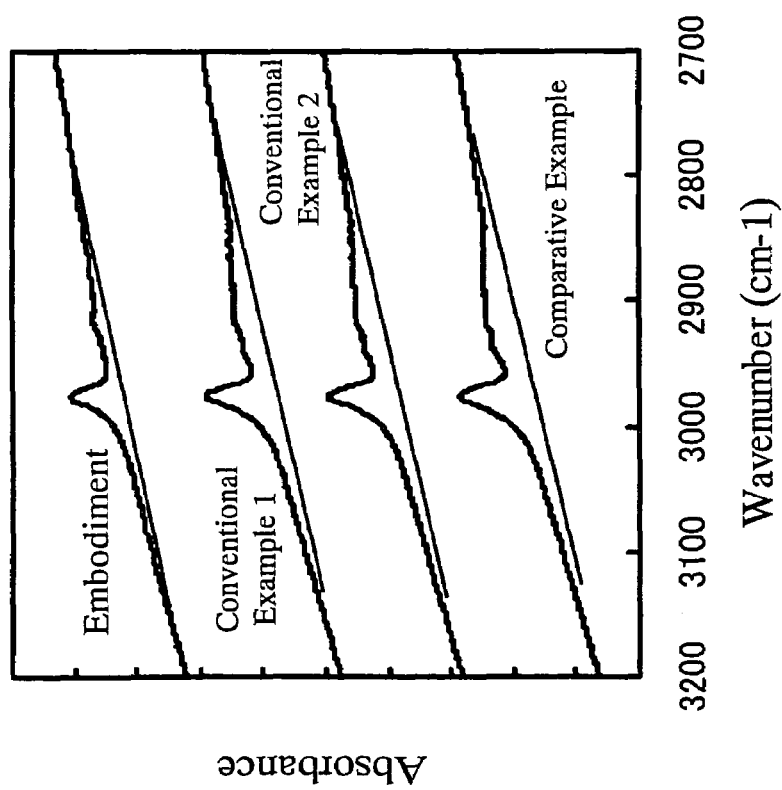
*Fig.9 (a)*
*Fig.9 (b)*
(1) Comparative Example
(2) Conventional Example 2
(3) Conventional Example 1
(4) Embodiment

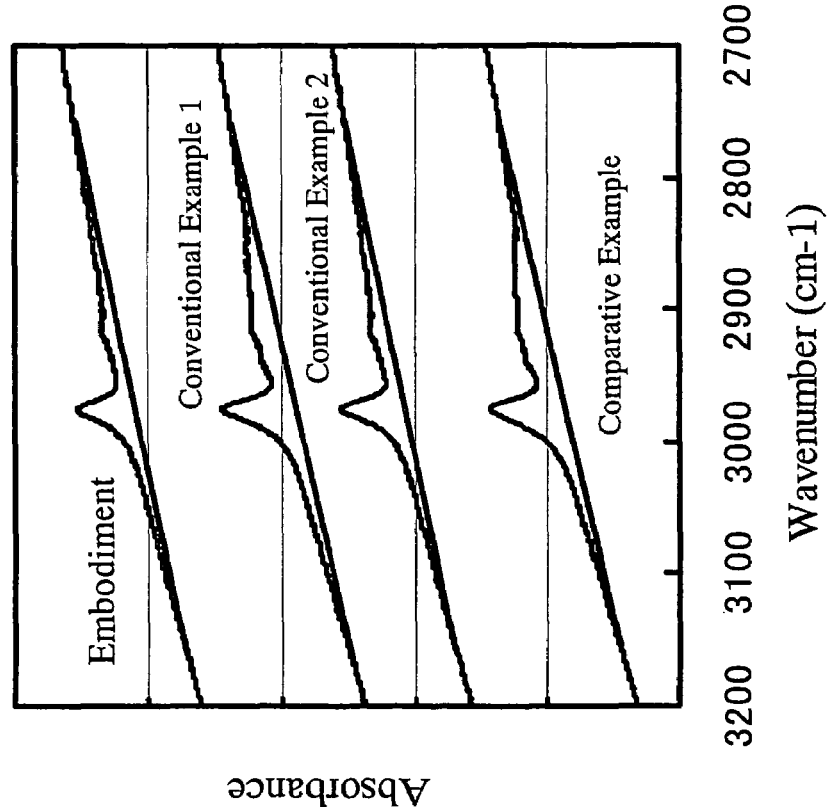
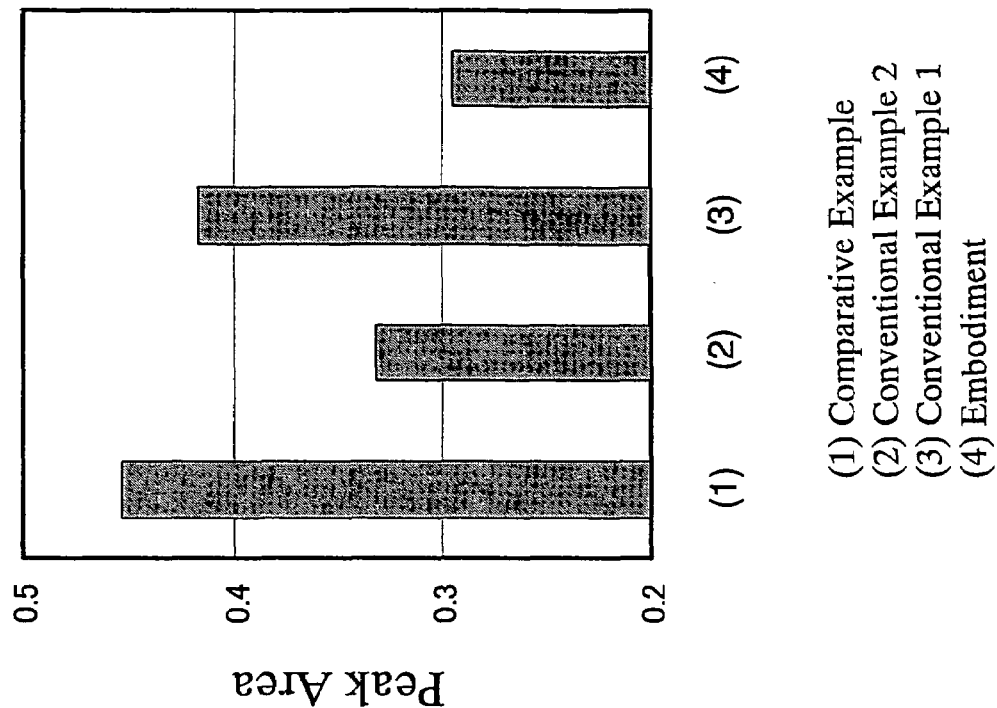

METHOD FOR MANUFACTURING SEMICONDUCTOR DEVICE

BACKGROUND OF THE INVENTION

1. Field of the Invention

The present invention relates to a method for manufacturing a semiconductor device, and more specifically to a method for manufacturing a semiconductor device using a porous low dielectric constant insulating film.

2. Background Art

In recent years, the speed of semiconductor device has significantly increased, and concurrently, transmission delay due to the lowered signal transmission speed caused by wiring resistance in a multilayer wiring portion, and parasitic capacitance between wirings or between wiring layers has caused problems. Such problems tend to be more significant, because wiring resistance rises and parasitic capacitance increases with the reduction of wiring width and wiring distance accompanying the high integration of semiconductor devices.

Heretofore, in order to prevent signal delay caused by such a rise of wiring resistance and increase of parasitic capacitance, a copper wiring substituting an aluminum wiring has been introduced, and the use of an insulating film having a low dielectric constant (hereafter referred to as low-k film) has been examined as an interlayer insulating film.

One of the methods for forming a copper wiring using a low-k film is the Damascene method. This method has been known as a method for forming a wiring without etching copper, in view of the fact that copper is more difficult to control the etching rate than aluminum.

Specifically, the Damascene method is a method for forming a copper wiring layer, wherein an opening is formed by the dry etching of a low-k film using a resist film as a mask, and then, the resist film is removed by ashing, and a copper layer is embedded in the opening. The copper layer can be embedded by forming a copper film so as to fill the opening using a plating method, and the surface is planarized using a CMP (chemical mechanical polishing) method so as to leave the copper film only in the opening.

On the other hand, as low-k films, organic insulating films, such as an SiOC (carbon doped silicon oxide) film formed by introducing methyl groups into an $SiO_2$ (silicon oxide) film, and a polyarylether derivative film, have been known. However, since the dielectric constant of these films is about 2.6 to 2.9, further reduction of the dielectric constant has been demanded toward semiconductor devices in the generation when further miniaturization of the design rule has been progressed. Therefore, the use of a porous low-k film having pores of a diameter of several to several tens of angstroms has been expected (see, e.g., Japanese Patent Laid-Open No. 2002-50687 and Japanese Patent Laid-Open No. 11-310411 (1999)).

Heretofore, a porous low-k film has been formed by applying a polysiloxane resin composition containing a pore-generating material (porogen) onto a semiconductor substrate, and performing heat treatment to the polysiloxane resin composition.

The heat treatment accelerates the curing reaction of polysiloxane, and simultaneously causes the decomposition and vaporization of the pore-generating material. This results in formation of a lot of micro pores in the insulating film. Here, if the decomposition of the pore-generating material is activated before the completion of the curing reaction of polysiloxane, the size of the generated pores becomes small, and porosity lowers. Therefore, the conventional methods have been designed to activate the decomposition of the pore-generating material at a temperature higher than the curing temperature of polysiloxane. Specifically, in order to generate pores, the polysiloxane resin composition has been heat-treated at a temperature of 400° C. or above.

However, there has been a problem that heat treatment at such a high temperature causes the reliability of copper wirings to lower. Therefore, it is an urgent necessity to develop a heat treatment method that can be performed at a lower temperature.

In the steps of dry etching and ashing in the Damascene method, the porous low-k film is easily undergone charging damage by plasma. Furthermore, in the cleaning step, the cleaning solution easily permeates into the porous low-k film. There has also been a problem that the properties of the porous low-k film as an interlayer insulating film are thereby affected to lower the electrical properties and reliability of the semiconductor device.

SUMMARY OF THE INVENTION

Therefore, the object of the present invention is to solve the above-described problems. Specifically, the object of the present invention is to provide a method for manufacturing a semiconductor device having excellent electrical properties and reliability by using a porous insulating film.

According to one aspect of the present invention, in a method for manufacturing a semiconductor device, an insulating film composition containing an insulating film precursor and a pore-generating material is applied onto a semiconductor substrate. A non-porous insulating film is formed by performing first heat treatment to the insulating film composition at a temperature of 350° C. or below in an inert-gas atmosphere to polymerize the insulating film precursor. A CMP stopper film is formed on the non-porous insulating film. A resist pattern is formed on the CMP stopper film.

The CMP stopper film and the non-porous insulating film are performed dry etching using the resist pattern as a mask to form a trench in the non-porous insulating film. The resist pattern is removed by a ashing process. The surface of the semiconductor substrate is cleaned after the ashing process. After cleaning, a porous insulating film is formed by performing second heat treatment to the non-porous insulating film in an oxidizing-gas atmosphere to remove the pore-generating material from the non-porous insulating film. A barrier metal film is formed on the CMP stopper film and on the inner surface of the trench. A copper layer is formed on the barrier metal film so as to bury the trench. The copper layer and said barrier metal film are polished using a CMP method to form a copper wiring.

Other objects and advantages of the present invention will become apparent from the following description.

BRIEF DESCRIPTION OF THE DRAWINGS

FIG. 1 is a cross-sectional view illustrating a method for manufacturing a semiconductor device according to the embodiment.

FIG. 2 is a cross-sectional view illustrating a method for manufacturing a semiconductor device according to the embodiment.

FIG. 3 is a cross-sectional view illustrating a method for manufacturing a semiconductor device according to the embodiment.

FIG. 9(a) shows an example of change in the absorption peaks of organic components including a pore-generating material.

FIG. 9(b) shows the comparison of the areas of the absorption peaks shown in FIG. 9(a).

FIG. 10(a) shows another example of change in the absorption peaks of organic components including a pore-generating material.

FIG. 10(b) shows the comparison of the areas of the absorption peaks shown in FIG. 10(a).

DETAILED DESCRIPTION OF THE PREFERRED EMBODIMENTS

Figure 4:
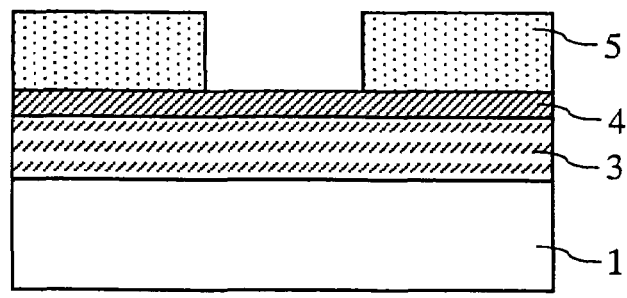
FIG. 4 is a cross-sectional view illustrating a method for manufacturing a semiconductor device according to the embodiment.

The present inventor conducted repetitive studies, and found that a semiconductor device that excelled in electrical properties and reliability could be manufactured by forming a wiring trench in the stage of curing polysiloxane, and thereafter performing heat treatment at a high temperature to vaporize and remove a pore-generating material. According to this method, the wiring trench is formed in the state wherein no pores are present in the interlayer insulating film. Therefore, during dry etching and ashing, the interlayer insulating film is not damaged by plasma charging, and the cleaning solution does not permeate into the interlayer insulating film. Furthermore, since pores are formed by decomposing and vaporizing the pore-generating material after the formation of the wiring trench, the relative dielectric constant of the interlayer insulating film can be lowered. Therefore, a semiconductor device having a small parasitic capacitance between wiring layers, excellent electrical properties, and high reliability can be manufactured.

An embodiment of the present invention will be described below in further detail referring to the drawings. The description about normal LSI manufacturing steps, such as the formation of an MOS transistor, a diffusion layer and a plug, will be omitted for the conciseness of description, and only the step for forming a metal wiring will be described.

FIGS. 1 to 6 and FIGS. 13 to 15 are sectional views illustrating a method for manufacturing a semiconductor device according to the embodiment. In these drawings, the parts denoted by the same reference numerals are the same parts.

First, as FIG. 1 shows, an insulating film composition 2 to be an interlayer insulating film is applied onto a semiconductor substrate 1. The insulating film composition 2 can be applied using a spin coating method or the like. The insulating film composition 2 may be applied after an etching stopper film or a diffusion prevention film is formed on the semiconductor substrate 1.

As the insulating film composition 2, for example, a silica-based resin composition containing a pore-generating material can be used. Specifically, the insulating film composition 2 may contain an insulating film precursor and a pore-generating material. The insulating film composition 2 may also contain an appropriate solvent.

The examples of porous insulating films that can be used in the embodiment include a porous polysiloxane film containing $SiO_2$ as the major component, such as methyl silsesquioxane (MSQ) and hydrogenated silsesquioxane (HSQ); a porous organic-inorganic hybrid film; and a porous film formed of the polymer of an aromatic compound, such as polyimide derivatives, polyarylether derivatives, polyquinoline derivatives and polyparaxylene derivatives. Therefore, any precursors of these compounds can be used as the above-described insulating film precursor.

The examples of pore-generating materials include vinyl-ether-based compounds, vinyl-pyridine-based compounds, styrene-based compounds, alkylester-vinyl-based compounds, (metha) acrylate-based compound, and polymers having an alkylene oxide structure.

Next, as FIG. 2 shows, a first heat treatment step is performed to the insulating film composition 2. The purpose of this step is to form a film by polymerizing the insulating film precursor contained in the insulating film composition 2 without vaporizing the pore-generating material. Here, the first heat treatment step is performed at a temperature of 350° C. or below in an inert-gas atmosphere. As the inert gas, for example, nitrogen ($N_2$), Helium (He) or argon (Ar) can be used. Although FIG. 2 shows that the semiconductor substrate 1 is heated from the top, the embodiment is not limited thereto, but the semiconductor substrate 1 may be heated from the bottom, or from the entire circumference.

As long as the above heating conditions are used, the pore-generating material remains in the film even after the first heat treatment step. Heating in an oxygen-gas atmosphere, or heating at a temperature higher than 350° C. is not preferred because the decomposition or vaporization of the pore-generating material occurs easily. Although it is preferable that the pore-generating material is not decomposed during the first heat treatment step, even if the pore-generating material is decomposed during the first heat treatment step, it should remain in the film without vaporized.

In this embodiment, the first heat treatment step is not necessarily limited to a one-stage step, but can be a step of two or more stages. For example, when the insulating film composition 2 contains a solvent, after performing the heat treatment for the purpose of vaporizing and removing the solvent (Step 1), the heat treatment for polymerizing the insulating film precursor to form the film (Step 2) can be performed. In this case, the temperature of the Step 2 heat treatment is performed at a temperature higher than the temperature of the Step 1 heat treatment.

The insulating film composition 2 forms a non-porous insulating film 3 by performing the first heat treatment step (FIG. 3). Here, the non-porous insulating film 3 is a film that contains the pore-generating material therein. In other words, the non-porous insulating film 3 is an interlayer insulating film in the state where no pores have been formed therein.

Next, a CMP stopper film 4 is formed on the non-porous insulating film 3 (FIG. 4). The CMP stopper film 4 is formed using an insulating material having a large selection ratio of polishing rate to the porous insulating film 19 formed in the subsequent steps. Specifically, the CMP stopper film 4 can be formed using, for example, an SiC film, an $Si_xN_y$ (e.g., $Si_3N_4$, $Si_2N_3$, SiN, etc.) film, an SiCN film, or an SiOC film, appropriately determined depending on the type of the porous insulating film 19. These films can be formed using a CVD (chemical vapor deposition, hereafter abbreviated as CVD) method, a sputtering method or a coating method.

The CMP stopper film 4 may have a thickness enough to secure a desired polishing margin. However, since the relative dielectric constant of materials used for the CMP stopper film 4 are generally high, it is preferable that the CMP stopper film 4 remaining after polishing is as thin as possible. For example, it is preferable that the CMP stopper film 4 is formed to have a thickness of 50 to 100 nm, and the thickness is reduced to about 30 nm or less after polishing.

After forming the CMP stopper film 4, a resist pattern 5 is formed thereon to be a structure shown in FIG. 4. Specifically, after applying a photoresist (not shown) onto the non-porous insulating film 3, an exposure light is radiated thereon through a predetermined mask (not shown). Thereafter, the photoresist is developed to form the resist pattern 5.

The kind of exposure light can be appropriately selected depending on the design rule of the semiconductor device. For example, in the design rules of 0.25 μm to 0.13 μm, 90 nm, and 65 nm or below, a KrF (krypton fluoride) excimer laser (wavelength: 248 nm), an ArF (argon fluoride) excimer laser (wavelength: 193 nm), and an $F_2$ laser (wavelength: 157 nm) are used as the light source for the exposure apparatus, respectively.

Figure 5:
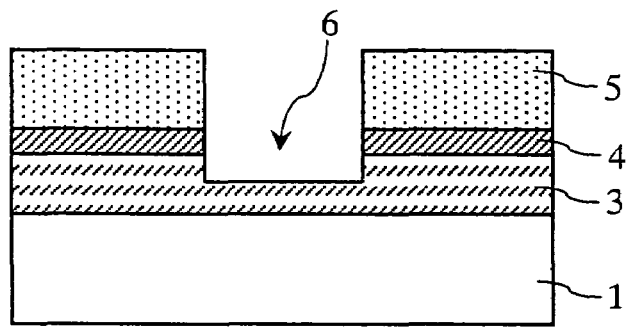
FIG. 5 is a cross-sectional view illustrating a method for manufacturing a semiconductor device according to the embodiment.

Next, the CMP stopper film 4 and the non-porous insulating film 3 are subjected to dry etching using the resist pattern 5 as the mask. Thereby, as FIG. 5 shows, a trench 6 for a copper wiring is formed in the non-porous insulating film 3.

Here, as a dry-etching apparatus, for example, a dual frequency exciting parallel plate reactive ion etching apparatus that can impress high frequencies of 60 MHz and 2 MHz to the upper electrode and the lower electrode, respectively, can be used. Specifically, a mixed gas consisting of octafluorosyclobutane ($C_4F_8$), nitrogen ($N_2$) and argon (Ar) is introduced into the apparatus as the etching gas, and while maintaining the pressure at 150 mTorr, RF powers of 1000 W and 1400 W are impressed to the upper electrode and the lower electrode, respectively, to generate plasma. At this time, the flow-rate ratio of the etching gas can be 10 sccm for octafluorosyclobutane, 225 sccm for nitrogen, and 1400 sccm for argon. The surface temperature of the stage for placing the substrated can be maintained at 25° C.

The non-porous insulating film 3 can be etched using gases other than the above-described mixed gas. For example, the mixed gas consisting of tetrafluoromethane ($CF_4$), difluoromethane ($CH_2F_2$), neon (Ne) and argon (Ar) can also be used.

After the trench 6 has been formed, the resist pattern 5 no longer required is removed by ashing. Here, as an ashing apparatus, for example, a parallel plate reactive ion etching apparatus that can impress a high frequency of 13.56 MHz to the lower electrode can be used. Specifically, ammonia ($NH_3$) gas is introduced into the apparatus at a flow rate of 300 sccm, and RF power of 300 W is impressed to the lower electrode with maintaining the pressure at 10 Pa to generate plasma. At this time, the surface temperature of the stage for placing the substrate can be maintained at 25° C.

Ashing can be performed using oxygen; however, from a point of view of minimizing damage to the non-porous insulating film 3, ashing in a reducing atmosphere containing hydrogen is preferred.

According to this embodiment, since dry etching and ashing steps are carried out in the state where no pores have been generated in the interlayer insulating film, the phenomenon of the accumulation of electric charge in pores can be minimized to prevent the charging damage of the interlayer insulating film.

After ashing the resist pattern 5, the surface of the semiconductor substrate 1 is cleaned using a suitable cleaning solution. Cleaning can be performed, for example, by ejecting the cleaning solution from the cleaning apparatus onto the semiconductor substrate 1. Thereby, contaminants and the like produced during the dry etching step or the ashing step can be removed. In this embodiment, since cleaning is performed in the state of the non-porous insulating film, specifically in the state where no pores have been generated, the permeation of the cleaning solution into the interlayer insulating film by the incorporation of the cleaning solution in the pores can be prevented.

Figure 6:
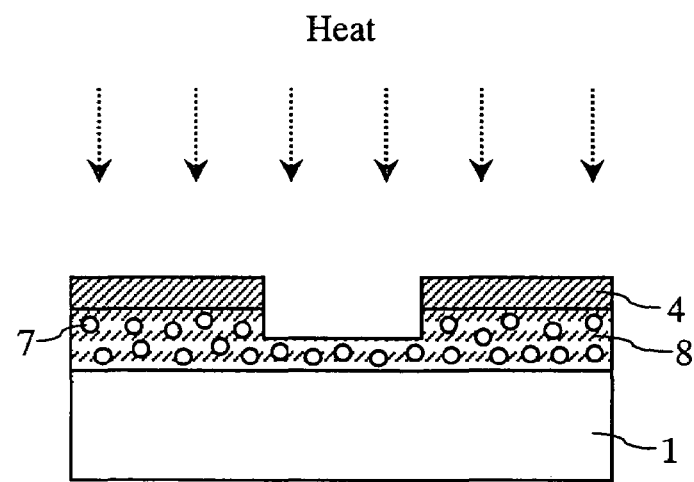
FIG. 6 is a cross-sectional view illustrating a method for manufacturing a semiconductor device according to the embodiment.

After forming the trench 6 in the non-porous insulating film 3 using the above steps, second heat treatment is performed to the non-porous insulating film 3. The purpose of the second heat treatment is to forcedly decompose and vaporize the pore-generating material remaining in the non-porous insulating film 3. By vaporizing and removing the pore-generating material from the resin matrix composing the non-porous insulating film 3, the non-porous insulating film 3 can be converted to a porous insulating film 8 having many pores 7 (FIG. 6). Although FIG. 6 shows that the semiconductor substrate 1 is heated from the top, the embodiment is not limited thereto, but the semiconductor substrate 1 can be heated from the bottom, or from the entire circumference.

The second heat treatment step is carried out in an oxidizing-gas atmosphere. Since the pore-generating material has a high reactivity with oxygen, heating in the oxidizing-gas atmosphere accelerates the decomposition and vaporization of the pore-generating material, and can lower the heating temperature in this step. As the oxidizing gas, oxygen gas or a gas containing oxygen can be used. Oxygen gas containing ozone or oxygen radicals can also be used.

Figure 7:
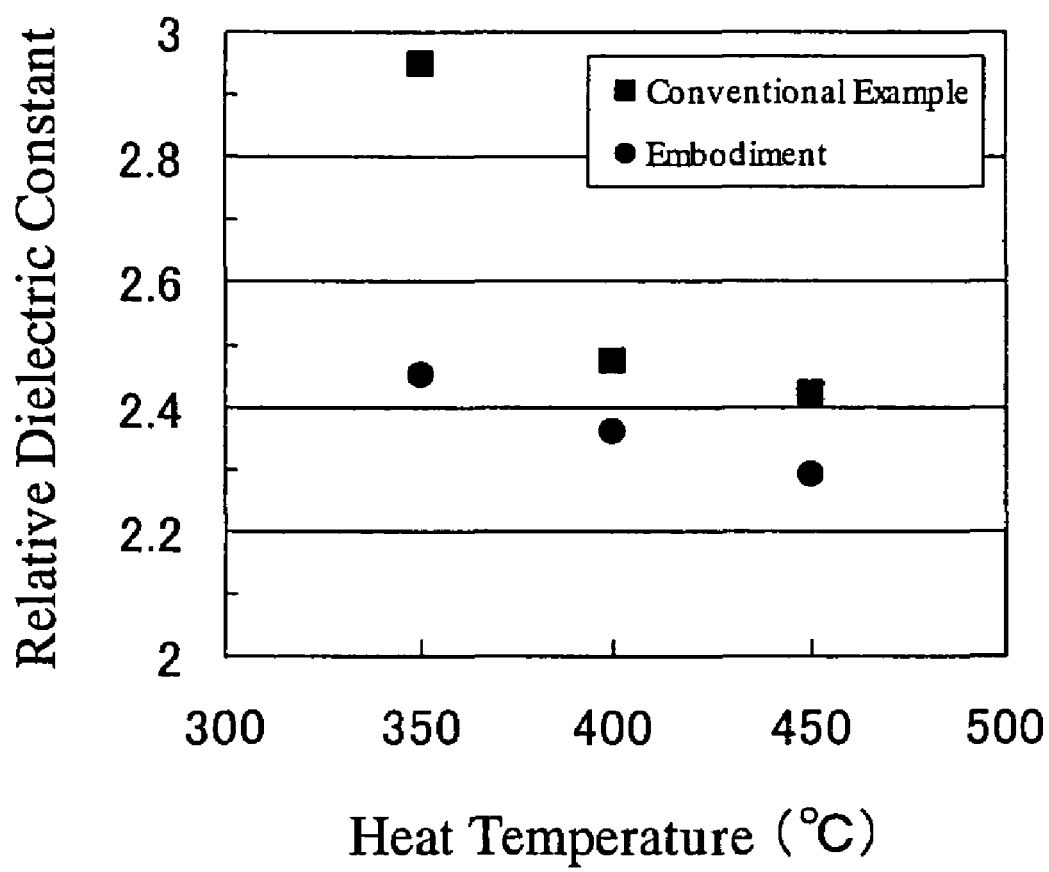
FIG. 7 shows the relationship between the heating temperature and the relative dielectric constant of a insulating film.

FIG. 7 is a graph showing the relationship between the heating temperature in the second heat treatment step and the relative dielectric constant of a porous insulating film formed by the heat treatment. In the example of FIG. 7, after performing heat treatment at 350° C. for 5 minutes in a nitrogen-gas atmosphere (corresponding to the first heat treatment step), heat treatment for 5 minutes in a gas atmosphere including oxygen (corresponding to the second heat treatment step) was performed. For comparison, an example, wherein only heat treatment for 5 minutes in a nitrogen-gas atmosphere (corresponding to a conventional method), is also shown.

It can be seen from FIG. 7 that the relative dielectric constant of the porous insulating film formed in this embodiment is generally lower than the relative dielectric constant of conventional examples. Specifically, in order to obtain a relative dielectric constant of about 2.4 by removing the pore-generating material, conventional examples require heating to about 450° C. According to this embodiment, on the other hand, since the pore-generating material is removed using the reaction of oxygen with the pore-generating material, substantially the same value of relative dielectric constant can be obtained using a lower temperature than conventional methods. Specifically, according to this embodiment, since an insulating film having a relative dielectric constant of about 2.4 can be formed at a temperature of about 350° C., the heating temperature nearly 100 degrees lower than the temperature in conventional examples can be used.

Figure 8:
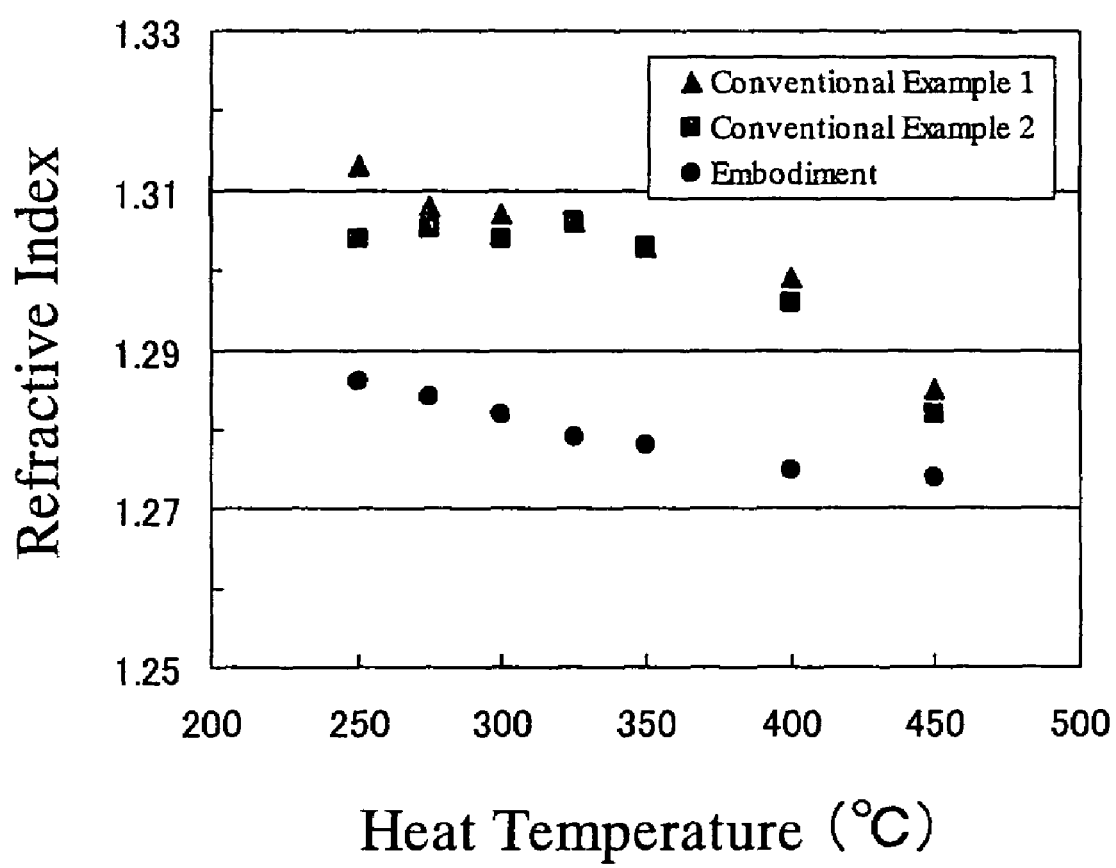
FIG. 8 shows the relationship between the heating temperature and the index of refraction of a insulating film.

FIG. 8 is a graph showing the relationship between the heating temperature in the second heat treatment step and the index of refraction of a porous insulating film formed by the heat treatment. Since the index of refraction lowers as the pore-generating material is removed, the removal rate of the pore-generating material versus heating temperature can be evaluated by checking change in the index of refraction. In the example of FIG. 8, after performing heat treatment at 350° C. for 5 minutes in a nitrogen-gas atmosphere (corresponding to the first heat treatment step), heat treatment for 5 minutes in a gas atmosphere including oxygen (corresponding to the second heat treatment step) was performed. For comparison, examples, wherein only heat treatment for 5 minutes in a nitrogen-gas atmosphere (corresponding to Conventional Example 1), and only heat treatment for 10 minutes in a nitrogen-gas atmosphere (corresponding to Conventional Example 2) are also shown.

It can be seen from FIG. 8 that the index of refraction lowers sharply at temperatures of 350° C. and above, indicating that the decomposition and vaporization of the pore-generating material are rapidly progressed. In Conventional Examples, little difference in the index of refraction due to difference in heating temperatures can be observed. On the other hand, the index of refraction in this embodiment is generally lower than the index of refraction in Conventional Examples. For example, after heating at about 350° C., the index of refraction in this embodiment is equal to, or lower than the index of refraction after heating at about 450° C. in Conventional Examples. Therefore, according to this embodiment, the pore-generating material can be removed at a low temperature, which cannot be achieved by only heat treatment in a nitrogen-gas atmosphere.

FIG. 9(a) shows an example of change in the absorption peaks of the organic components including a pore-generating material before and after the second heat treatment step compared, by changing the heating conditions of the second heat treatment step. FIG. 9(b) shows the comparison of the areas of the absorption peaks (2,750 cm$^{-1}$ to 3,150 cm$^{-1}$) shown in FIG. 9(a). These drawings show, a sample (Comparative Example) after performing only heat treatment at 350° C. for 5 minutes in a nitrogen-gas atmosphere (corresponding to the first heat treatment step), a sample (the embodiment) after performing heat treatment at 350° C. for 5 minutes, and then performing heat treatment for 5 minutes in the atmosphere (corresponding to the second heat treatment step); a sample (Conventional Example 1) after performing only heat treatment at 350° C. for 5 minutes in a nitrogen-gas atmosphere; and a sample (Conventional Example 2) after performing only heat treatment at 350° C. for 10 minutes in a nitrogen-gas atmosphere.

From FIGS. 9(a) and 9(b), it is seen that the second heat treatment performed in the atmosphere reduces the absorption peak of the pore-generating material significantly. This result supports that the decomposition of the pore-generating material is accelerated by heating in an inert-gas atmosphere.

FIG. 10(a) shows another example of change in the absorption peaks of the organic components including a pore-generating material before and after the second heat treatment step compared by changing the heating conditions of the second heat treatment step. FIG. 10(b) shows the comparison of the areas of the absorption peaks (2,750 cm$^{-1}$ to 3,150 cm$^{-1}$) shown in FIG. 10(a). These drawings show, a sample (Comparative Example) after performing only heat treatment at 350° C. for 5 minutes in a nitrogen-gas atmosphere (corresponding to the first heat treatment step), a sample (the embodiment) after performing heat treatment at 350° C. for 5 minutes, and then performing heat treatment for 5 minutes in the atmosphere (corresponding to the second heat treatment step); a sample (Conventional Example 1) after performing only heat treatment at 350° C. for 5 minutes in a nitrogen-gas atmosphere; and a sample (Conventional Example 2) after performing only heat treatment at 450° C. for 10 minutes in a nitrogen-gas atmosphere.

As seen from FIGS. 10(a) and 10(b), the second heat treatment performed in the atmosphere reduces the absorption peak of the pore-generating material significantly. According to this embodiment, the decomposition of the pore-generating material can be accelerated to the level equivalent to or lower than the case when the heat treatment is performed at 450° C.

Figure 11:
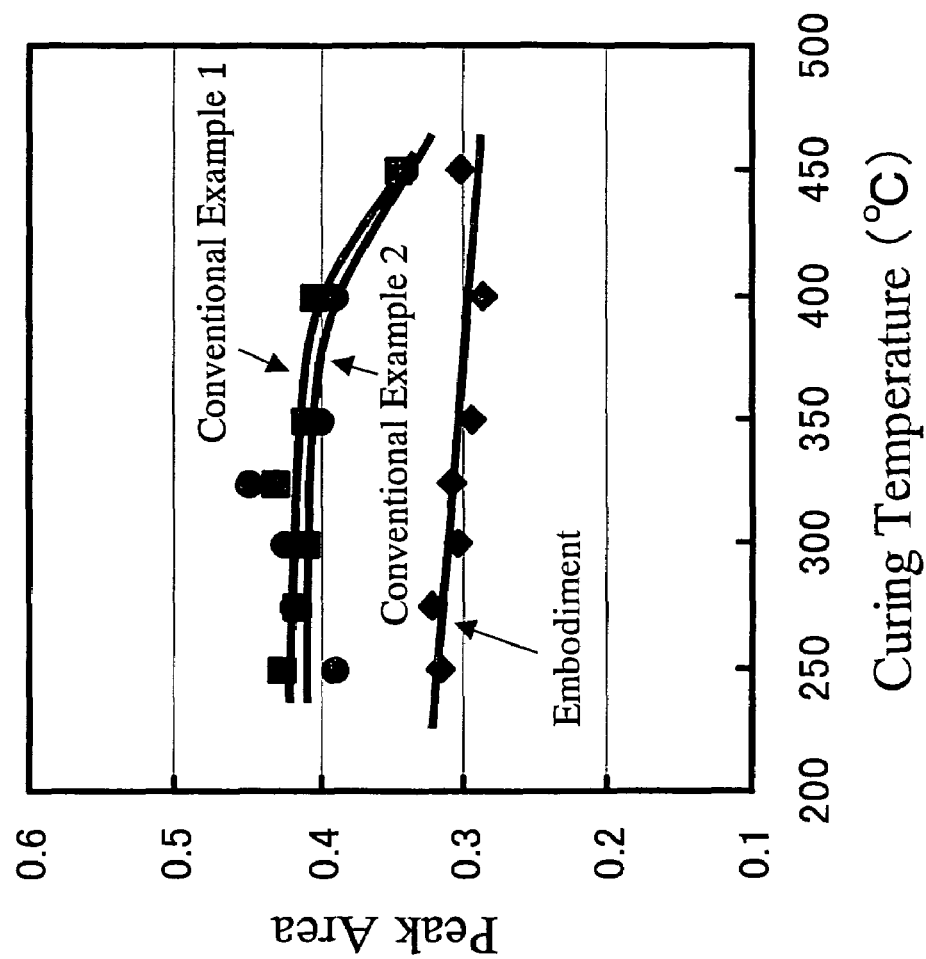
FIG. 11 shows the relationship between heating temperature and change in the absorption peak area of the pore-generating material.

FIG. 11 is a graph showing the relationship between heating temperature in the second heat treatment step and change in the absorption peak area of the pore-generating material by this heat treatment. Here, the absorption peak area means the area of absorption peak at 2,750 cm$^{-1}$ to 3,150 cm$^{-1}$. FIG. 11 shows a sample (the embodiment) after performing heat treatment at 350° C. for 5 minutes in a nitrogen-gas atmosphere (corresponding to the first heat treatment step), and then performing heat treatment for 5 minutes in an oxygen-containing-gas atmosphere (corresponding to the second heat treatment step); a sample (Conventional Example 1) after performing only heat treatment for 5 minutes in a nitrogen-gas atmosphere; and a sample (Conventional Example 2) after performing only heat treatment for 10 minutes in a nitrogen-gas atmosphere.

It is seen from FIG. 11 that according to Conventional Examples 1 and 2, since the absorption peak area narrows sharply at temperatures of 350° C. and above, the pore-generating material decomposes rapidly at 350° C. or above. Here, little difference due to difference in the heating time can be observed. According to this embodiment, on the other hand, the absorption peak area is generally lower than the absorption peak area in Conventional Examples. For example, by heating at about 350° C., the value equivalent to or lower than the case when the heat treatment is performed at about 450° C. can be obtained.

Figure 12:
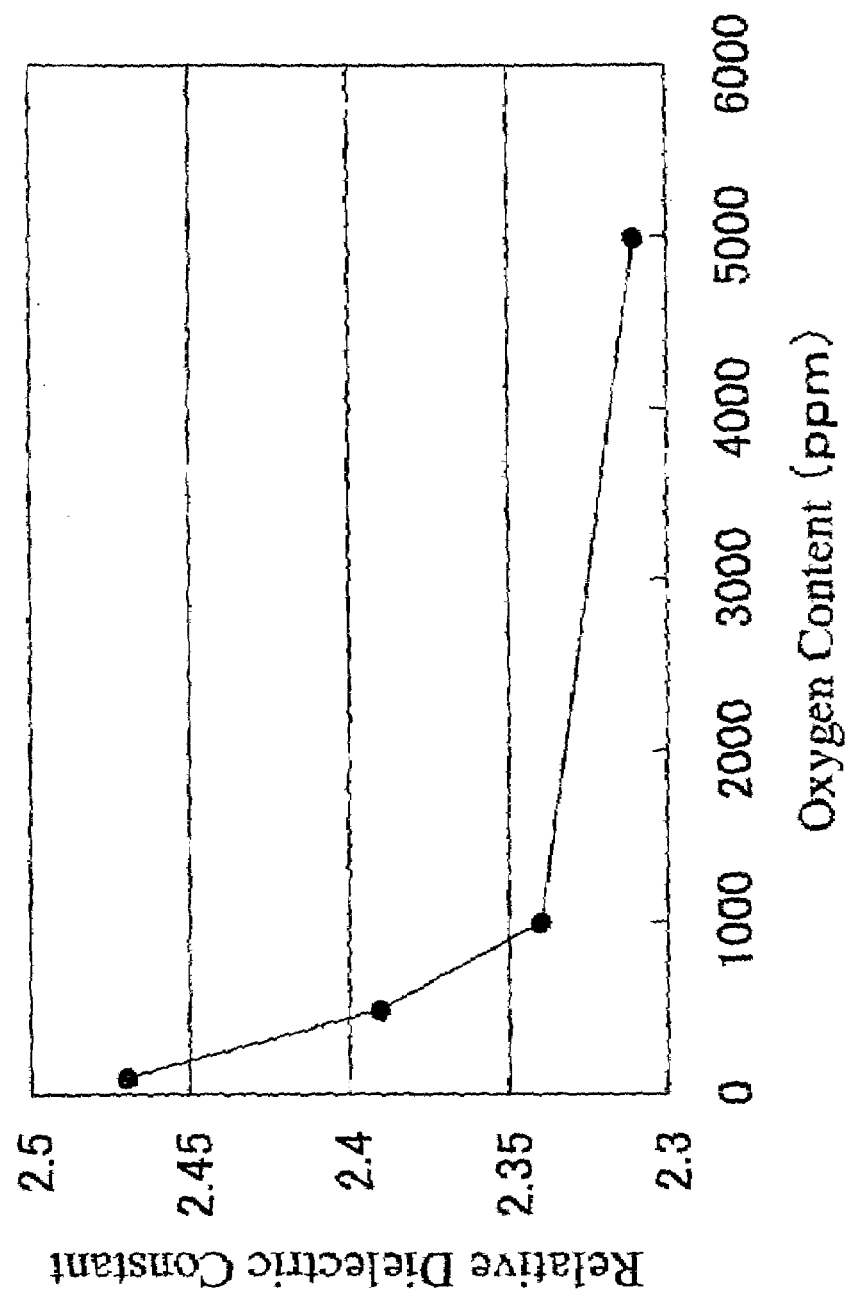
FIG. 12 shows the relationship between the oxygen content and the relative dielectric constant of the porous insulating film.

FIG. 12 is a graph showing the relationship between the oxygen content in the second heat treatment step and the relative dielectric constant of the porous insulating film formed by this treatment. In the example shown in FIG. 12, the temperature in the second heat treatment step is 400° C.

As seen from FIG. 12, the relative dielectric constant lowers with the elevation of the oxygen content in the second heat treatment step. This result supports that the film having higher porosity can be formed as the decomposition of the pore-generating material becomes activated.

In this embodiment, as described above, the temperature of the second heat treatment can be equal to, or lower than the temperature of the first heat treatment. For example, by performing the second heat treatment at 350° C. for 5 minutes in a nitrogen-gas atmosphere, the pore-generating material can be sufficiently removed to obtain an insulating film having a low dielectric constant.

For example, the first heat treatment is supposed to be carried out at a temperature of $T_1$, for a time of $t_1$, and the second heat treatment is supposed to be carried out at a temperature of $T_2$ for a time of $t_2$. When the condition (1) shown below is satisfied, $t_1$ can equal to $t_2(t_1=t_2)$. In this case, both $t_1$ and $t_2$ are 10 minutes or longer and 30 minutes or shorter. It is preferable that the temperature $T_2$ is as high as possible within the rang of the condition (1).

$$\left.\begin{array}{l} 300° \text{ C.} \leq T_1 \leq 400° \text{ C.} \\ 250° \text{ C.} \leq T_2 \leq 350° \text{ C.} \\ T_1 \geq T_2 \end{array}\right\} \quad (1)$$

In this embodiment, the first and second heat treatment steps can be carried out using a hot plate, a furnace, or an infrared heating furnace.

As FIG. 6 shows, by carrying out the second heat treatment step, the interlayer insulating film becomes a porous insulating film. Specifically, since the relative dielectric constant of the interlayer insulating film can be lowered by the generation of pores, a semiconductor device with a lowered parasitic capacitance and excellent electrical properties can be manufactured.

Figure 13:
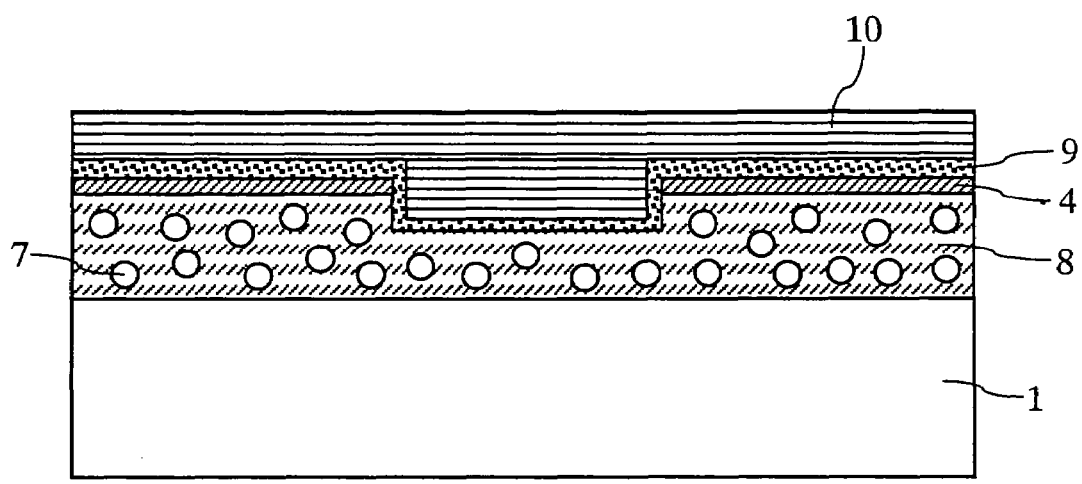
FIG. 13 is a cross-sectional view illustrating a method for manufacturing a semiconductor device according to the embodiment.
Figure 14:
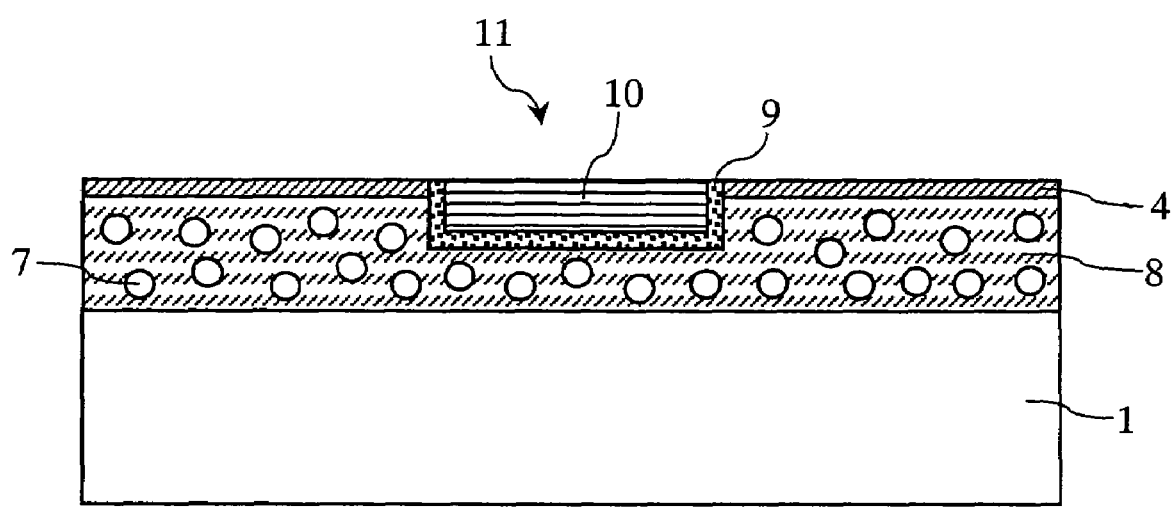
FIG. 14 is a cross-sectional view illustrating a method for manufacturing a semiconductor device according to the embodiment.

After the second heat treatment step, a barrier metal film 9 is formed on the inner surface of the trench 6, and a copper layer 10 is embedded in the trench 6 through the barrier metal film 9 to form a copper wiring 11 (FIGS. 13 and 14). This step can be specifically performed as flows.

First, a barrier metal film 9, such as a titanium nitride film and a tantalum nitride film, is formed on the CMP stopper film 4 including the inner surface of the trench 6, using a CVD method or a sputtering method. Next, a copper layer 10 is formed on the barrier metal film 9 so as to embed the trench 6. Then, the copper layer 10 and the barrier metal film 9 are polished using a chemical mechanical polishing (hereafter referred to as CMP) method. Thereby, the copper layer 10 and the barrier metal film 9 can be left only in the trench 6.

The formation of the barrier metal film 9 and the embedding of the copper layer 10 can be performed using other methods. For example, after forming the barrier metal film 9 only in the trench 6 using a CVD method or a CMP method, the copper layer 10 can be embedded in the trench 6 by a plating method using an electrolyte containing copper sulfate ($CuSO_4$) as the base component.

In the above CMP step, polishing must be performed so as not to produce short-circuiting between wirings while maintaining the thickness of the porous insulating film 8 within a predetermined range. By forming a CMP stopper film 4 on the porous insulating film 8, since a sufficient polishing margin can be secured regardless of the polishing speed of the porous insulating film 8, the processing accuracy of polishing can be improved, and the occurrence of short circuiting and the fluctuation of wiring resistance can be reduced.

According to this embodiment, as described above, the dry etching of the interlayer insulating film and the ashing of the resist pattern are performed in the state where the pore-generating material has not been decomposed and vaporized, the charging damage of the interlayer insulating film by plasma can be prevented. Similarly, since cleaning is performed in the state where the pore-generating material has not been decomposed and vaporized, the permeation of the cleaning solution into the interlayer insulating film can be prevented. This prevents the lowering of property of the interlayer insulating film so that a semiconductor device that excels in electrical properties and reliability can be manufactured.

According to this embodiment, since a porous interlayer insulating film is formed by decomposing and vaporizing a pore-generating material, an interlayer insulating film having a low relative dielectric constant can be obtained. This makes it possible to manufacture semiconductor devices having reduced parasitic capacitance between wiring layers and excellent electric properties.

Furthermore, according to this embodiment, the polishing margin for the formation of the copper wiring can be widened by forming a CMP stopper film. Therefore, the processing accuracy of polishing can be improved, and the occurrence of short circuiting and the fluctuation of wiring resistance can be reduced.

In this embodiment, although the example wherein a trench for a copper wiring is formed on a semiconductor substrate, the present invention is not limited thereto. The present invention can be applied to any uses of forming a porous insulating film through a plasma treatment step or a cleaning step. For example, the present invention can be applied to the case wherein an interlayer insulating film is formed on a semiconductor substrate having a copper wiring layer formed thereon, and a via hole or a wiring trench is formed in the interlayer insulating film using a resist pattern. The metal embedded in the trench or the via hole is not limited to copper, but other metals can also be used to form the conductive layer.

Figure 15:
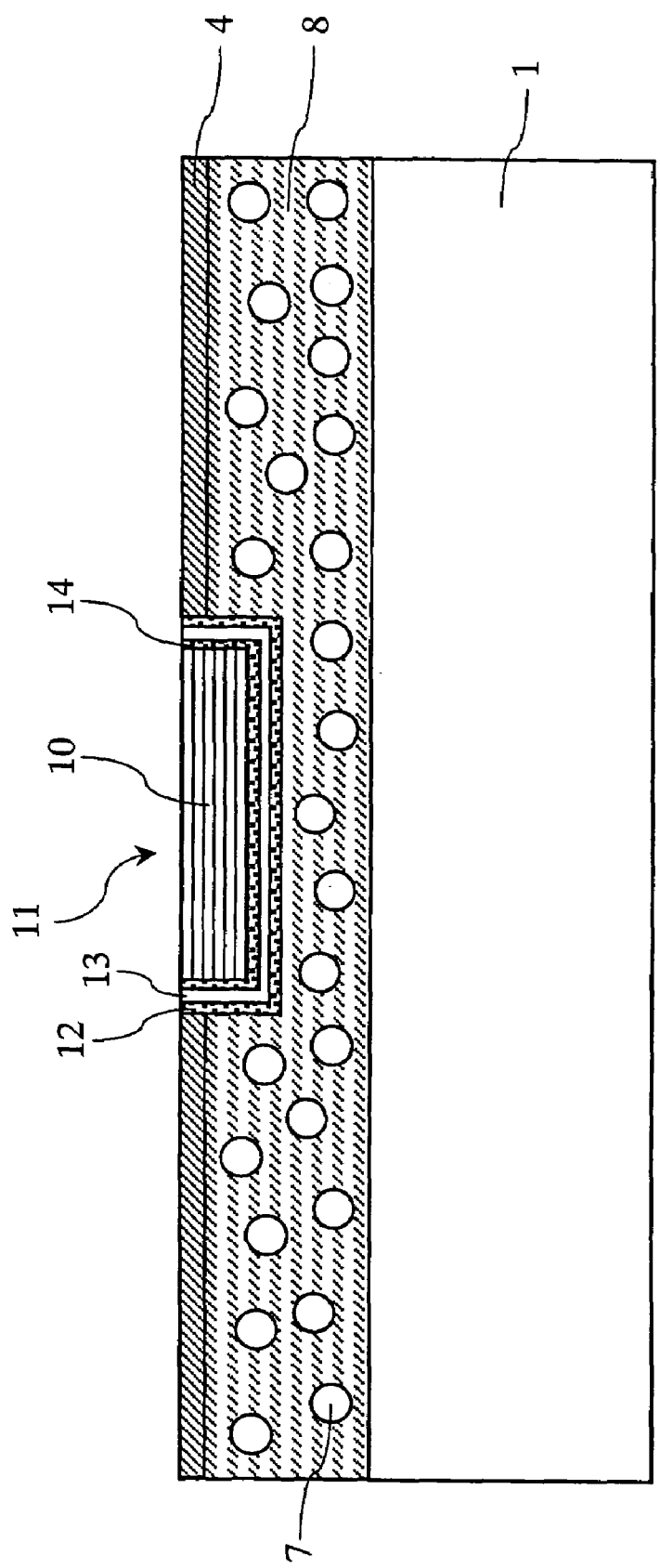
FIG. 15 is a cross-sectional view of barrier metal film according to the embodiment.

In the present invention, the production yield of a semiconductor device can be improved by forming a barrier metal film having the structure as shown in FIG. 15.

In FIG. 15, the barrier metal film has a structure having a tantalum film 12 formed by a sputtering method, a tantalum nitride film 13 formed by a CVD method, and a tantalum film 14 formed by a sputtering method in this order. The thickness of all of these films is preferably 5 nm or thinner. For example, the thickness of the tantalum films 12 and 14 can be 2 nm, respectively, and the thickness of the tantalum nitride film 13 can be 1 nm. By forming such a structure, the yield can be improved comparing to the case wherein the barrier metal film is a titanium nitride film or a tantalum nitride film formed using a CVD method. This will be described in detail below.

When the relationship between the film-forming time and the film-forming speed is checked for a tantalum film formed using a CVD method, the tendency that the film-forming speed is low is observed in the initial stage of film formation. This is caused by that tantalum is incorporated in the porous insulating film. On the other hand, the formation of a tantalum film formed as the base material using a sputtering method can solve the above problem. In addition, the formation of a tantalum film using a sputtering method on the tantalum nitride film formed using a CVD method can improve the adhesion with the copper layer. As long as the film thickness is as described above, the elevation of resistance due to the formation of the tantalum film can be within a negligible range.

The features and advantages of the present invention may be summarized as follows.

According to the present invention, as described above, the steps of dry etching, ashing and cleaning are carried out to a non-porous insulating film, the charging damage of the insulating film and the permeation of the cleaning solution into the insulating film can be prevented. In addition, since heat treatment is performed in an oxidizing atmosphere, the pore-generating material can be removed at a temperature lower than the temperature in conventional methods to form a porous insulating film.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-51432, filed on Feb. 26, 2004 including specification, claims, drawings and summary, on which the Convention priority of the present application is based, are incorporated herein by reference in its entirety.

What is claimed is:

1. A method of manufacturing a semiconductor device comprising:
    applying an insulating film composition containing an insulating film precursor and a pore-generating material onto a semiconductor substrate;
    first heat treating said insulating film composition at a first temperature, not exceeding 350° C., in an inert-gas ambient to polymerize said insulating film precursor and form a non-porous film;
    forming a chemical mechanical polishing (CMP) stopper film on said non-porous insulating film;
    forming a resist pattern on said CMP stopper film;
    dry etching said CMP stopper film and said non-porous insulating film using said resist pattern as a mask to form a trench in said non-porous insulating film;
    removing said resist pattern by ashing;
    cleaning said semiconductor substrate after the ashing;
    after the cleaning, second heat treating said non-porous insulating film at a second temperature that is no higher than the first temperature in an oxidizing-gas ambient, removing said pore-generating material from said non-porous insulating film, thereby forming a porous insulating film;
    forming a barrier metal film on said CMP stopper film and on inner surfaces of said trench;
    forming a copper layer on said barrier metal film, filling said trench; and
    polishing said copper layer and said barrier metal film by CMP, thereby forming a copper wiring.

2. The method of manufacturing a semiconductor device according to claim 1, wherein if the first temperature is $T_1$ and duration of the first heat treating is $t_1$, and the second temperature is $T_2$ and duration of the second heat treating is $t_2$, then:

$$300° C. \leq T_1 \leq 400° C.,$$

$$250° C. \leq T_2 \leq 350° C.,$$

and $$t_1 = t_2.$$

3. The method manufacturing a semiconductor device according to claim 1, including performing the ashing in a reducing ambient containing hydrogen.

4. The method manufacturing a semiconductor device according to claim 1, wherein said porous insulating film is selected from the group consisting of a methyl silsesquioxane film, an hydrogenated silsesquioxane film, an organic-inorganic hybrid film, a polyimide derivative film, a polyarylether derivative film, a polyquinone derivative film, and a polyparaxylene derivative film.

* * * * *